US010319597B2

(12) United States Patent
Liou et al.

(10) Patent No.: US 10,319,597 B2
(45) Date of Patent: Jun. 11, 2019

(54) SEMICONDUCTOR DEVICE WITH PARTICULAR FIN-SHAPED STRUCTURES AND FABRICATION METHOD THEREOF

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/880,506

(22) Filed: Jan. 25, 2018

(65) Prior Publication Data

US 2018/0151371 A1 May 31, 2018

Related U.S. Application Data

(62) Division of application No. 14/820,565, filed on Aug. 7, 2015, now Pat. No. 9,922,834.

(30) Foreign Application Priority Data

Jul. 1, 2015 (TW) .............................. 104121374 A

(51) Int. Cl.
| | |
|---|---|
| *H01L 21/283* | (2006.01) |
| *H01L 21/84* | (2006.01) |
| *H01L 21/8234* | (2006.01) |
| *H01L 21/31* | (2006.01) |
| *H01L 21/762* | (2006.01) |
| *H01L 21/308* | (2006.01) |

(52) U.S. Cl.
CPC .......... *H01L 21/283* (2013.01); *H01L 21/308* (2013.01); *H01L 21/31* (2013.01); *H01L 21/76224* (2013.01); *H01L 21/823431* (2013.01); *H01L 21/845* (2013.01)

(58) Field of Classification Search
None
See application file for complete search history.

(56) References Cited

U.S. PATENT DOCUMENTS

| | | | |
|---|---|---|---|
| 6,960,517 B2 | 11/2005 | Rios | |
| 8,629,512 B2 | 1/2014 | Liaw | |
| 8,969,974 B2 | 3/2015 | Liaw | |
| 8,987,100 B2 | 3/2015 | Oh | |

(Continued)

FOREIGN PATENT DOCUMENTS

| | | |
|---|---|---|
| TW | 201133793 A1 | 10/2011 |
| TW | 201320192 A1 | 5/2013 |
| TW | 201428975 A | 7/2014 |

*Primary Examiner* — Su C Kim
*Assistant Examiner* — David S Wilbert
(74) *Attorney, Agent, or Firm* — Winston Hsu

(57) ABSTRACT

A semiconductor device includes first fin-shaped structures and second fin-shaped structures, which are separately disposed on a semiconductor substrate. Each of the first and second fin-shaped structures includes a base portion and a top portion protruding from the top portion. The base portions of the second fin-shaped structures are wider than the top portions of the second fin-shaped structures, and the top portions of the second fin-shaped structures are as wide as the top portions of the first fin-shaped structures. Each second fin-shaped structure further includes a recessed region on its sidewall.

7 Claims, 8 Drawing Sheets

(56) References Cited

U.S. PATENT DOCUMENTS

| | | |
|---|---|---|
| 9,000,537 B2 | 4/2015 | Cai |
| 2013/0277720 A1* | 10/2013 | Kim ..................... H01L 29/785 |
| | | 257/288 |
| 2013/0320448 A1 | 12/2013 | Cappellani |
| 2015/0001468 A1 | 1/2015 | Huang |
| 2015/0017781 A1 | 1/2015 | Lin |
| 2015/0147874 A1 | 5/2015 | Huang |
| 2016/0268434 A1* | 9/2016 | Ching ................. H01L 29/7851 |
| 2016/0308032 A1* | 10/2016 | Glass ................ H01L 29/66795 |
| 2016/0322501 A1* | 11/2016 | Cheng ................ H01L 29/7851 |

* cited by examiner

SEMICONDUCTOR DEVICE WITH PARTICULAR FIN-SHAPED STRUCTURES AND FABRICATION METHOD THEREOF

CROSS REFERENCE TO RELATED APPLICATIONS

This application is a divisional application of U.S. application Ser. No. 14/820,565 filed Aug. 7, 2015, the disclosure of which is incorporated herein by reference in its entirety.

BACKGROUND OF THE INVENTION

1. Field of the Invention

The present invention relates generally to the field of semiconductor devices, and more particularly to a fin-shaped structure in a non-planar semiconductor device.

2. Description of the Prior Art

With the increasing miniaturization of semiconductor devices, various multi-gate MOSFET devices have been developed. The multi-gate MOSFETs are advantageous for the following reasons. First, the manufacturing processes of the multi-gate MOSFET devices can be integrated into traditional logic device processes easily, and thus are more compatible. In addition, since the three-dimensional structure of a multi-gate MOSFET increases the overlapping area between the gate and the substrate, its channel region can be controlled more effectively. This therefore reduces drain-induced barrier lowering (DIBL) effect and short channel effect (SCE). Moreover, the channel region is longer for a similar gate length. Therefore, the current between the source and the drain is increased. Besides, there is still a need to increase the density of the semiconductor devices in an integrated circuit.

SUMMARY OF THE INVENTION

A semiconductor device is disclosed according to one embodiment of the invention, the device which includes first fin-shaped structures and second fin-shaped structures separately disposed on a semiconductor substrate. Each of the first and second fin-shaped structures includes a base portion and a top portion protruding from the top portion. The base portions of the second fin-shaped structures are wider than the top portions of the second fin-shaped structures, and the top portions of the second fin-shaped structures are as wide as the top portions of the first fin-shaped structures. Each second fin-shaped structure further includes a recessed region on its sidewall.

According to another embodiment of the present invention, a method of fabricating a semiconductor device is also disclosed and includes the following steps: providing a semiconductor substrate having a first region and a second region, forming a patterned mask in the first and second regions of the semiconductor substrate, etching the semiconductor substrate by using the patterned mask as an etch mask so as to form a patterned structure on the surface of the semiconductor substrate, forming a spacer disposed on the sidewall of the patterned structure in the second region, etching the semiconductor substrate by using the patterned mask and the spacer as an etch mask so as to form a plurality of fin-shaped structures in the first and second regions of the semiconductor substrate, forming a first mask layer covering the fin-shaped structures in the first region, forming an oxide layer on sidewalls of the fin-shaped structures exposed from the first mask layer, the patterned mask and the spacer in the second region, and removing the oxide layer, so that a number of the fin-shaped structures in the second region have base portions narrower than top portions and the other fin-shaped structures in the second region have the base portions wider than the top portions.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
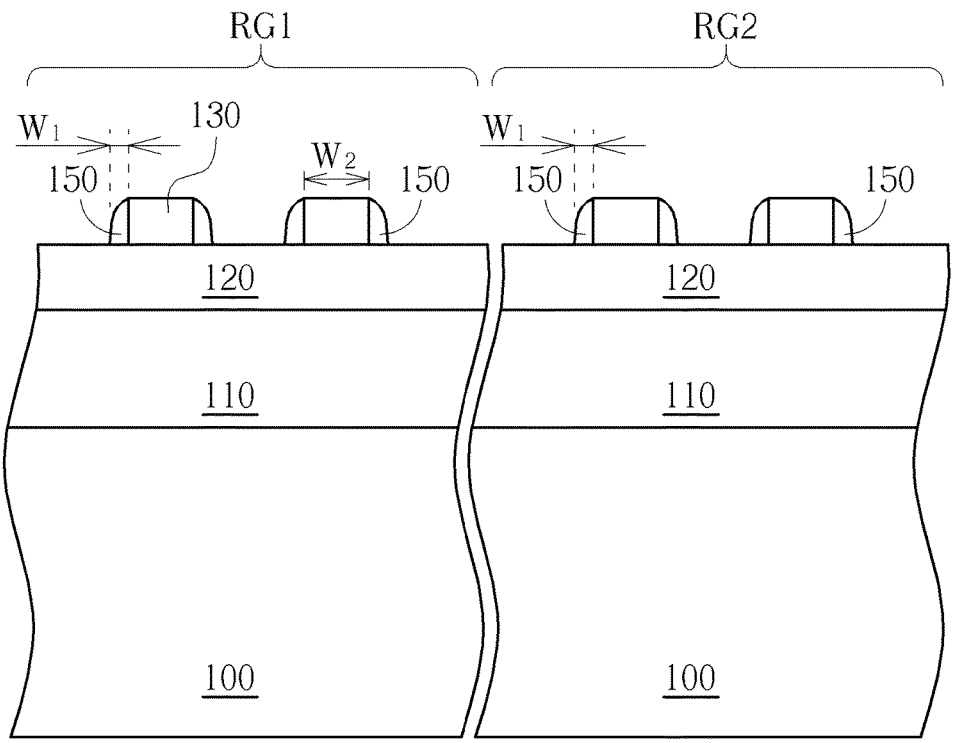
FIG. 1 to FIG. 15 are schematic diagrams showing a method for fabricating a semiconductor device according to preferred embodiments of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity unless express so defined herein. Moreover, each embodiment described and illustrated herein includes its complementary conductivity type embodiment as well. Like numbers refer to like elements throughout.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

Spatially relative terms, such as "inner," "outer," "beneath," "below," "lower," "above," "upper" and the like, may be used herein for ease of description to describe one element and/or feature's relationship to another element(s) and/or feature(s) as illustrated in the figures. Spatially relative terms may be intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular terms "a", "an," and "the" may be intended to include the plural forms as well, unless the context clearly indicates otherwise. The terms "comprises," "comprising," "includes" and/or "including" are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Please refer to FIG. 1. At the beginning of the fabrication process, a semiconductor substrate 100 having a first region RG 1 and a second region RG2 is provided. A mask layer, a sacrificial pattern 130 and spacers 150 are disposed on the semiconductor substrate 100. In detail, the mask layer may be single-layered or a double-layered structure, such as a double-layered structure including a first mask layer 110 and a second mask layer 120. The sacrificial pattern 130 may have a width W2 and include a plurality of stripe or ring-shaped features. The spacers 150 are disposed on the sidewalls of the sacrificial pattern 130 and have widths W1.

Because the sacrificial pattern 130 is fabricated by a photolithographic process and an etching process, the minimum dimension of the sacrificial pattern 130 are preferably greater than or equal to "the minimum feature sizes that the current exposure apparatus can achieve." Furthermore, because the spacers 150 are fabricated by depositing and etching a dielectric layer, the dimensions of the spacers 150 may be less than "the minimum feature sizes that the current exposure apparatus can achieve." That is to say, the spacers 150 may have widths W1 less than the widths W2 of the sacrificial pattern 130 and are therefore called sub-lithographic features.

The substrate 100 may be a semiconductor substrate (such as a silicon substrate), a silicon containing substrate (such as a silicon carbide substrate), a III-V group-on-silicon (such as GaN-on-silicon) substrate, a graphene-on-silicon substrate, a silicon-on-insulator (SOI) substrate or an epitaxial layer containing substrate. The first and second mask layers 110 and 120 are made of dielectric, such as silicon oxide or a silicon nitride, but not limited thereto. The sacrificial pattern 130 may be made of silicon material, III-V group semiconductors or other suitable semiconductor materials, and preferably be made of polysilicon material. The spacers 150 may be made of silicon oxide, silicon nitride, oxynitride, silicon carbide or other suitable dielectric materials different from the first and second mask layers 110 and 120 and the sacrificial pattern 130.

Figure 2:
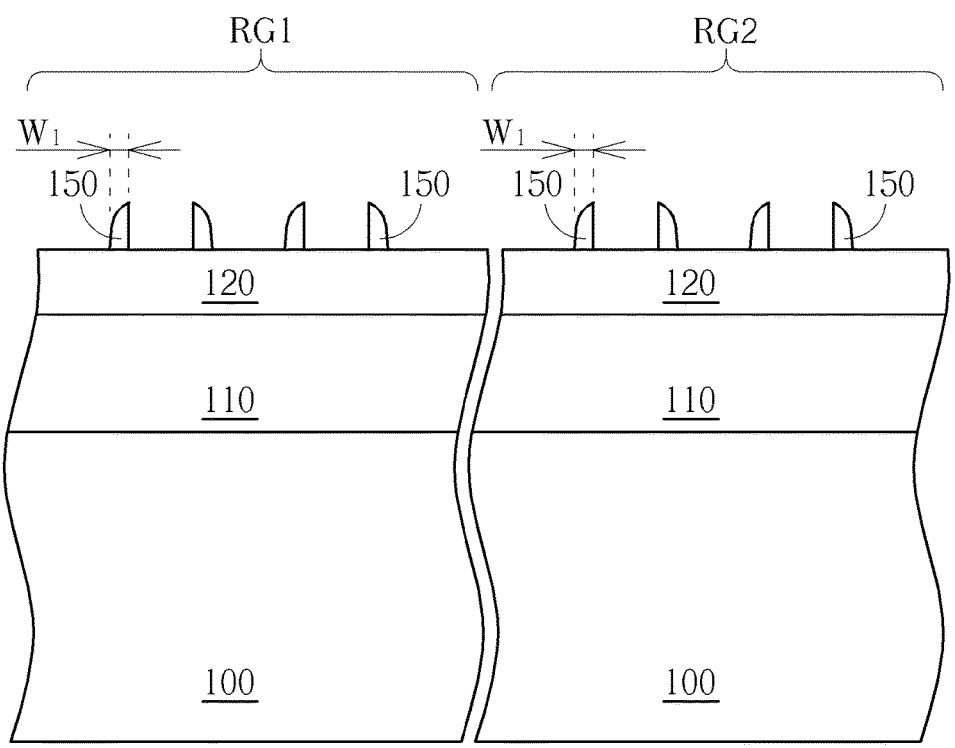

Please refer to FIG. 2. The sacrificial pattern 130 is removed completely until the underlying second mask layer 120 is exposed. Afterwards, by using the spacers as an etch mask, an etching process is then carried out to sequentially transfer the pattern consisting of the spacers 150 into the underlying second mask layer 120 and the first mask layer 110. The corresponding structure fabricated by these processes is shown in FIG. 3.

Figure 3:
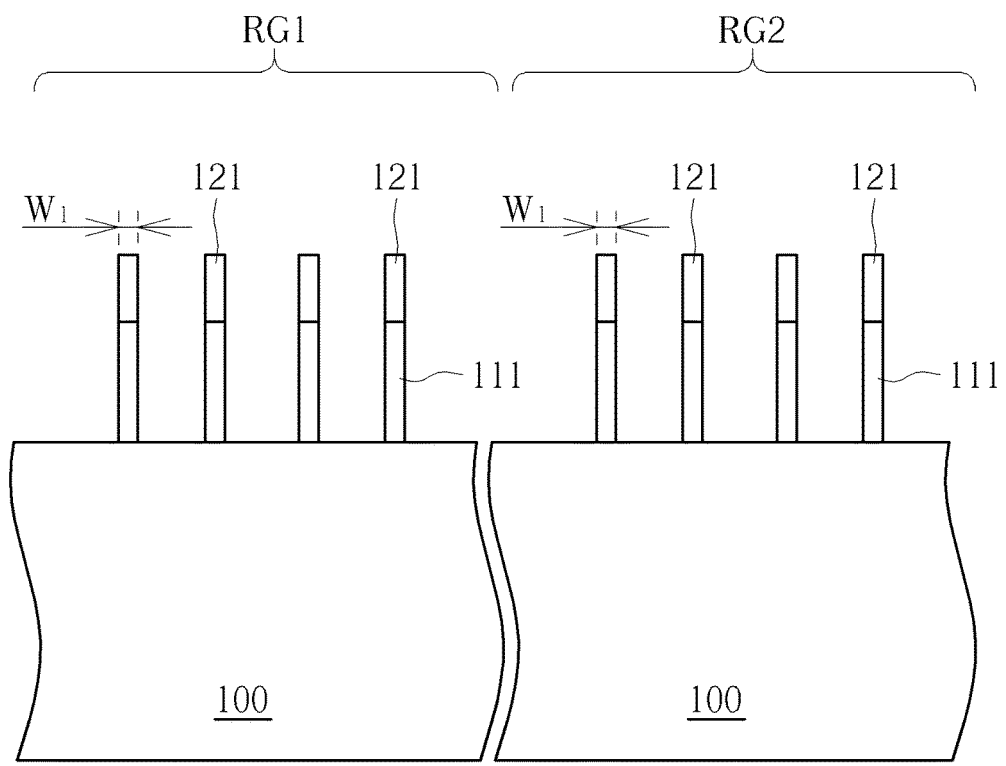

Please refer to FIG. 3. A patterned first mask layer 111 and a patterned second mask layer 121, also called patterned mask, may be fabricated by the above-mentioned etching process, and portions of the surface of the semiconductor substrate 100 are exposed from the patterned mask. Because the pattern of the patterned mask is fabricated by transferring the pattern of the spacers 150, the widths of the patterned mask are preferably equal to or less than the widths W1 of the spacers. Then, the semiconductor substrate 100 is further etched when covered by the patterned second mask layer 121 and the patterned first mask layer 111.

Figure 4:
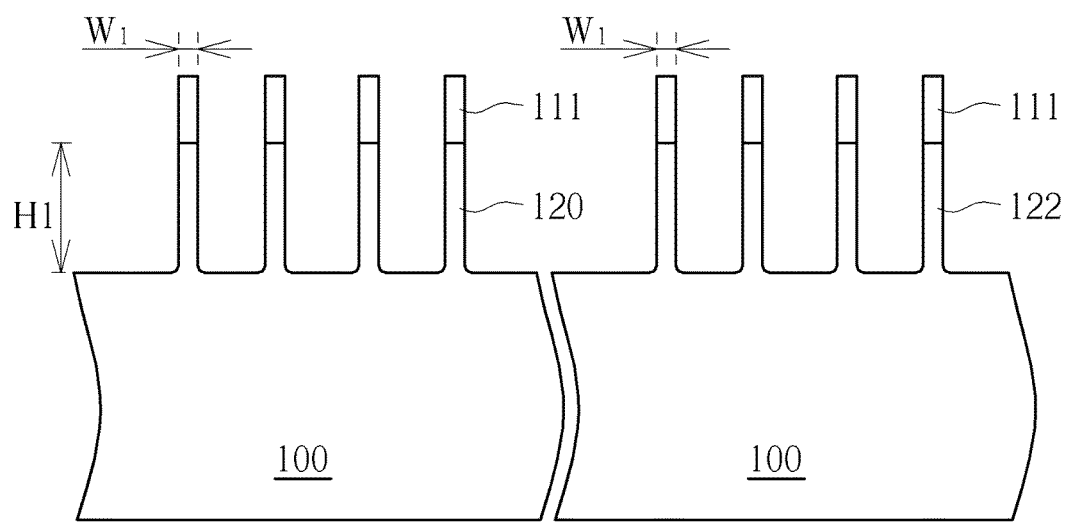

Please refer to FIG. 4. The patterned second mask layer 121 is completely removed during the step shown in FIG. 3, and the patterned first mask layer 11 is still left on the semiconductor substrate 100. In this way, patterned structure, also called top portions of the fin-shaped structure 120 and 122, is fabricated in the first region RG 1 and the second region RG2 of the semiconductor substrate 100, which has a predetermined first height H1.

The processes of sequentially forming the sacrificial pattern, forming the spacers, removing the sacrificial pattern and transferring the pattern of the spacers to the underlying mask layer may also be called "a spacer self-aligned double patterning (SADP) process." Therefore, the patterned masks disclosed-above are preferably "sub-lithographic features" and the dimensions of which are less than "the minimum feature sizes that the current exposure apparatus can achieve." In addition, other types of double patterning processes may also be applied as an alternative of the SADP process.

Figure 5:
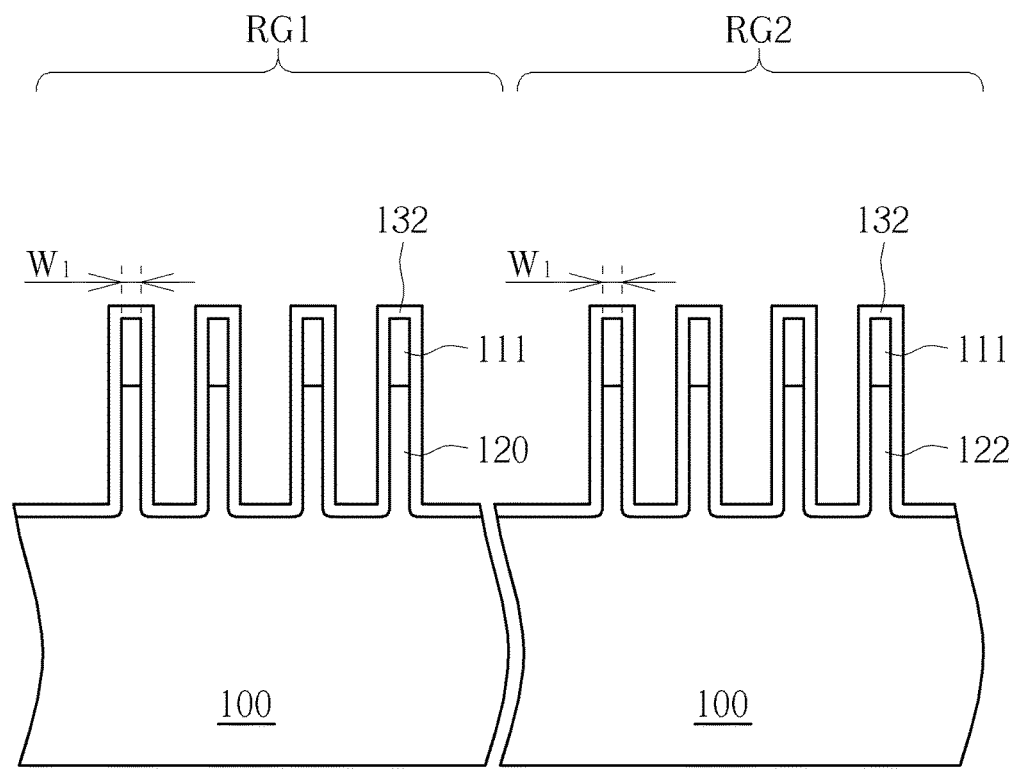

Please refer to FIG. 5. After the step shown in FIG. 4, a material layer 132 is then conformally deposited on the surface of the patterned first mask layer 111 and the surface of the top portions of the fin-shaped structures 120 and 122. The composition of the material layer 132 may be chosen from silicon nitride, silicon oxide, silicon oxynitride, silicon carbide and so forth, and is preferably different from that of the underlying semiconductor substrate 100.

Figure 6:
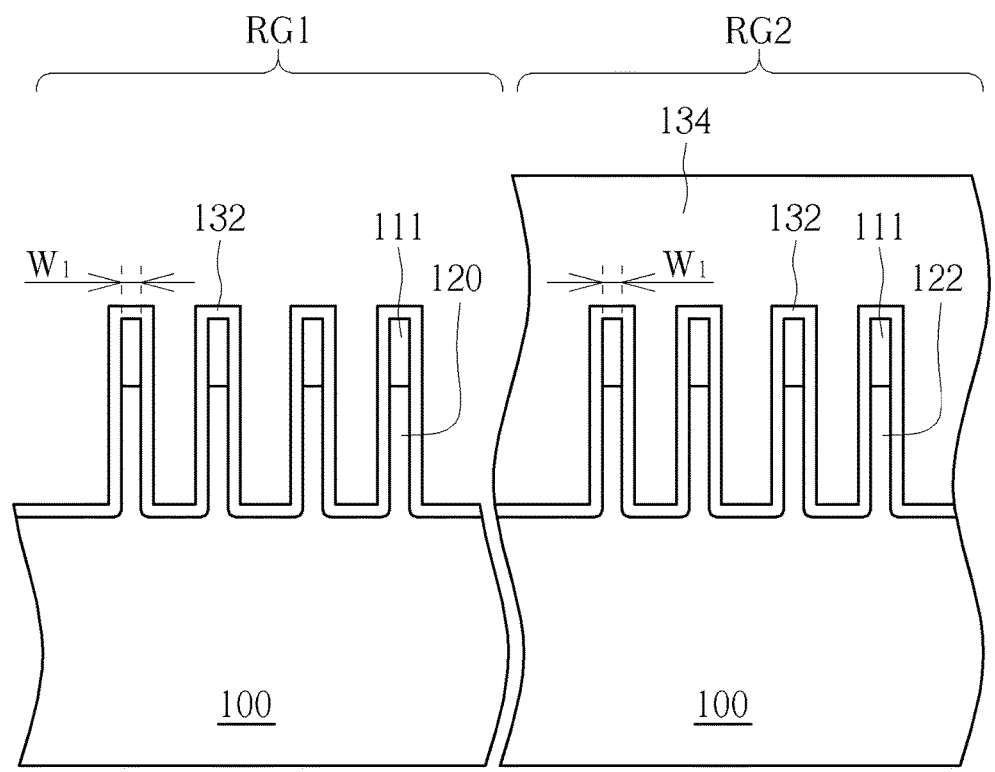

Please refer to the FIG. 6. A mask layer 134 is then formed to cover the material layer 132, the patterned first mask layer 11 and the top potions of the fin-shaped structures 122 in the second region PG2. In this way, the material layer 132 in the first region PG1 may be exposed from the mask layer 134. In detail, the composition of the mask layer 134 is different that of the underlying material layer 132 and is preferably made of photoresist. Then, an etching process is carried out by using the mask layer 134 as an etch mask. Through this process, the material layer 132 in the first region RG1 can be removed completely. Finally, the mask layer 134 is removed by a proper etching process.

Figure 7:
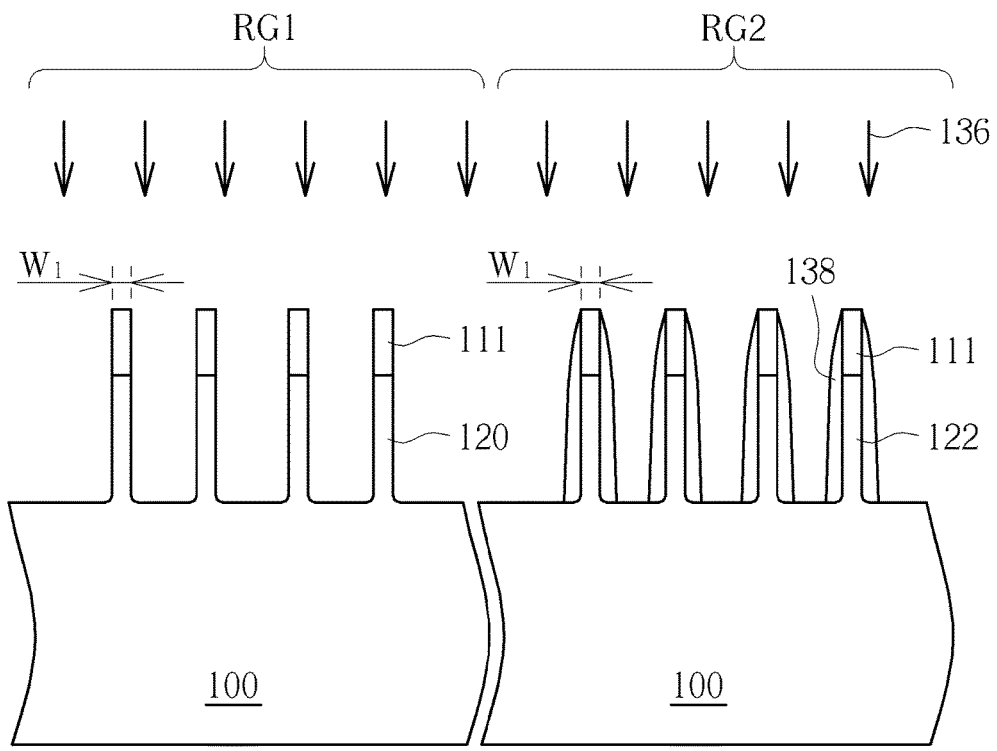

Please refer to FIG. 7. Another etching process 136 may be carried out to form spacers 138 on the sidewalls of the patterned structure in the second region RG2. In this embodiment, the widths of the spacers 138 may be greater or less than, preferably less than, those of the top portions 122 of the fin-shaped structures 122, but are not limited thereto.

The processes of fabricating the spacers 138 are not limited to the method disclosed above, that is, not limited to the steps of forming the mask layer 134, removing the material layer 132 in the first region RG1 when the semiconductor substrate 100 is covered by the mask layer 134, removing the mask layer 134 and fabricating spacers 138 in the second region RG2. The method may also be replaced with other processes. For example, an etching process is performed between the steps of depositing the material layer 132 and forming the mask layer 134 until the spacers 138 are fabricated in the first region RG1 and the second region RG2. The mask layer 134 is then fabricated to cover the spacers 138 in the second regions RG2. Another etching process is subsequently carried out when the spacers 138 in the first region RG1 is covered by the mask layer 134. In this way, the spacers 138 exposed form the mask layer 134 may be removed completely. Finally, the mask layer 134 is removed and the structure shown in FIG. 7 is therefore fabricated.

Figure 8:
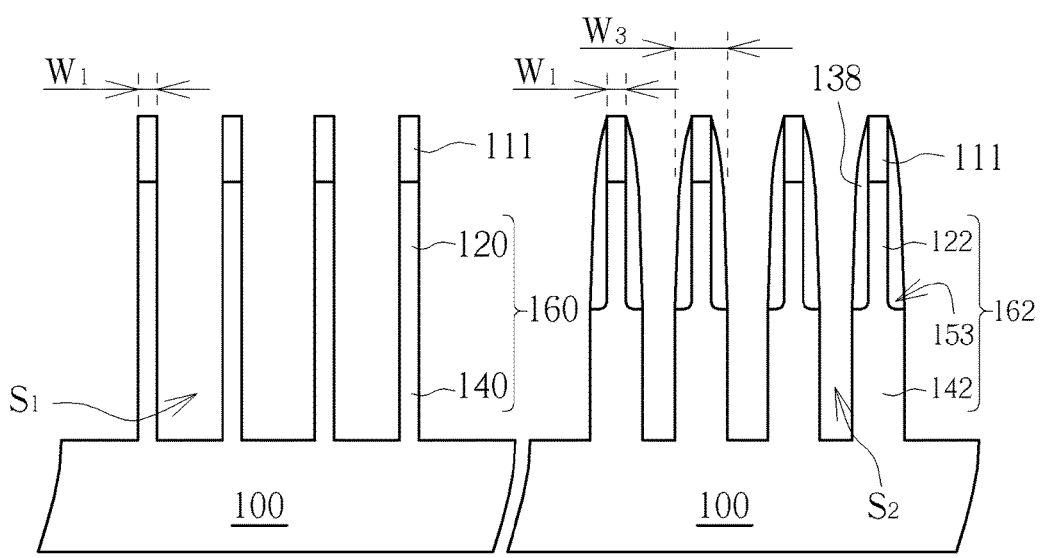

Please refer to FIG. 8. After the step shown in FIG. 7, another etching process may be carried out by using the patterned first mask layer 111 and the spacers 138 as an etch mask. Therefore, the pattern consisting of the patterned first mask layer 111 and the spacers 138 may be transferred to the semiconductor substrate 100 until base portions 140 and 142 of fin-shaped structure are fabricated. Specifically, by applying the processes disclosed above, a first fin-shaped structure 160 and a second fin-shaped structure 162 may be respectively fabricated in the first region RG1 and the second region RG2 of the semiconductor substrate 100. The first fin-shaped structure 160 and the second fin-shaped structure 162 are separately disposed on the semiconductor substrate, and each of which, from its bottom to its top, includes the base portion 140 and 142 and top portion 120 and 122 extending from the base portion 140 and 142. Because the top portion 120 and the base portion 140 of the first fin-shaped structure 160 are fabricated by transferring the pattern of the patterned first mask layer 111, and the top portion 122 of the second fin-shaped structure 162 are fabricated by transferring the pattern of the patterned first mask layer 111 and the spacers 138, the base portion 142 of the second fin-shaped structure 162 is greater than the width W1 of its top portion and the width W1 of the first fin-shaped structure 160. Preferably, the base portion 142 and the top portion 122 of the second fin-shaped structure 162 have smooth sidewalls, and the width W1 of the top surface of the first fin-shaped structure 160 is equal to the width W1 of the top surface of the second fin-shaped structure 162. Besides, the sidewall of the second fin-shaped structure 162 may further includes a recess, also called a recessed region, adjacent to the junction the base portion 142 and the top portion 122. The spacers 138 may be then completely removed after the base portions 140 and 142 of the fin-shaped structures are fabricated, and the top surface of the base portion 142 is thereby exposed.

Figure 9:
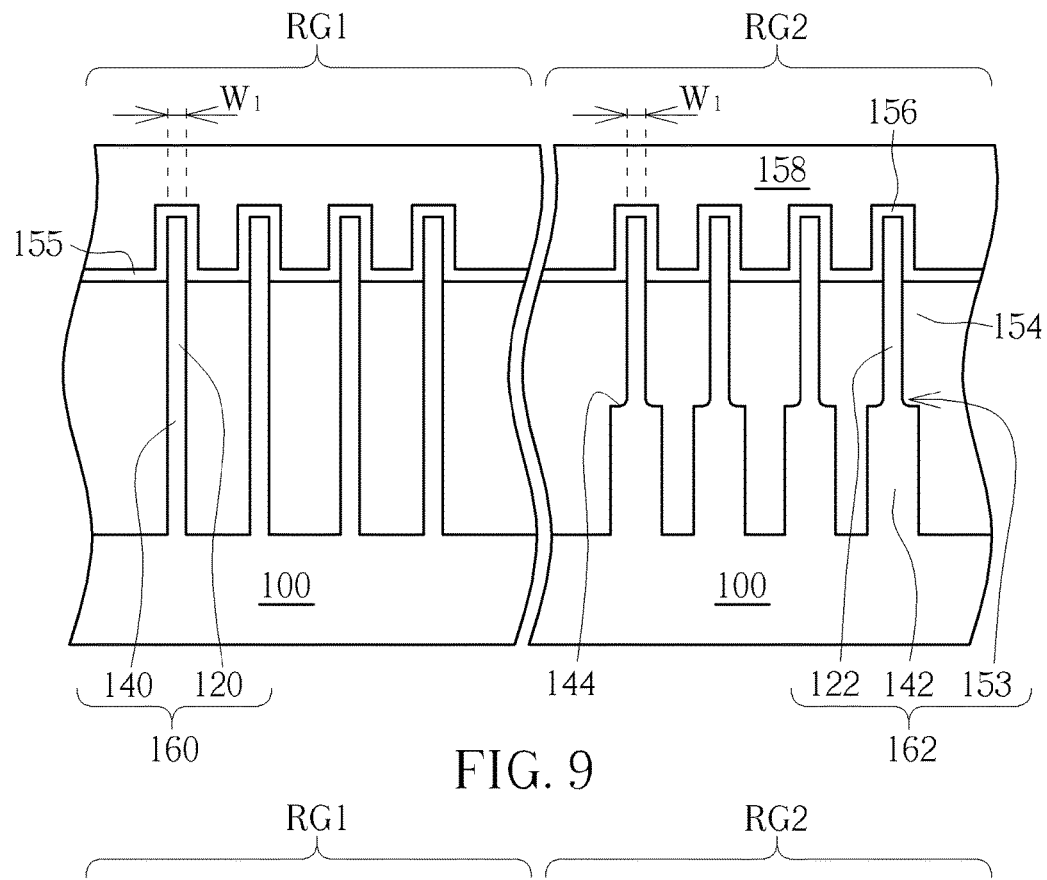

Please refer to FIG. 9. Following the step shown in FIG. 8, a step of depositing a dielectric layer may be carried out until the first and second fin-shaped structures 160 and 162 are covered by the dielectric layer. Afterwards, a planarization and an etching back process may be carried out sequentially to thereby fabricate a shallow trench isolation structure 154. The top surface of the shallow trench isolation structure 154 may have a predetermined height so that the first and second fin-shaped structures 160 and 162 may protrude from the top surface of the shallow trench isolation structure 154. In this embodiment, a top surface 155 of the shallow trench isolation 154 may be higher or lower than, preferably higher than, top surfaces 144 of the base portions 142, but is not limited thereto. Afterwards, a gate dielectric layer 156 conformally covering the fin-shaped structures 160 and 162 and a gate electrode layer 158 covering the gate dielectric layer 156 are sequentially deposited. Finally, a gate structure may be fabricated by patterning the gate dielectric layer 156 and the gate electrode layer 158.

In the preceding description, the present disclosure is described with reference to specifically exemplary embodiments thereof. It is, however, evident that various modifications and changes may be made thereto without departing from the broader spirit and scope of the present disclosure, as set forth in the claims. In the following paragraphs, a second embodiment and a third embodiment of the present invention are disclosed.

Figure 10:
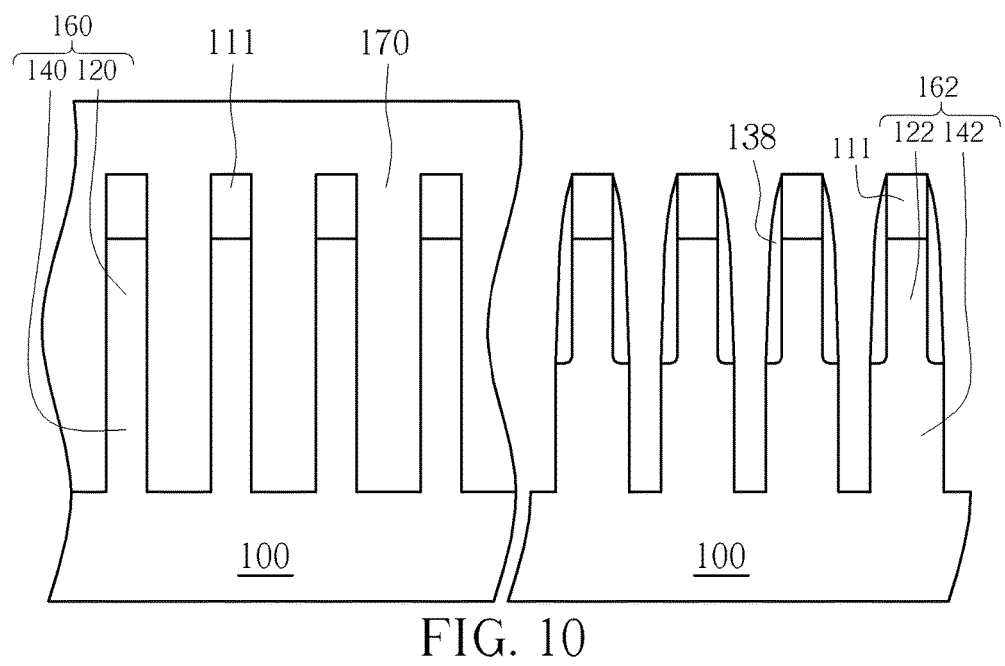
Figure 11:
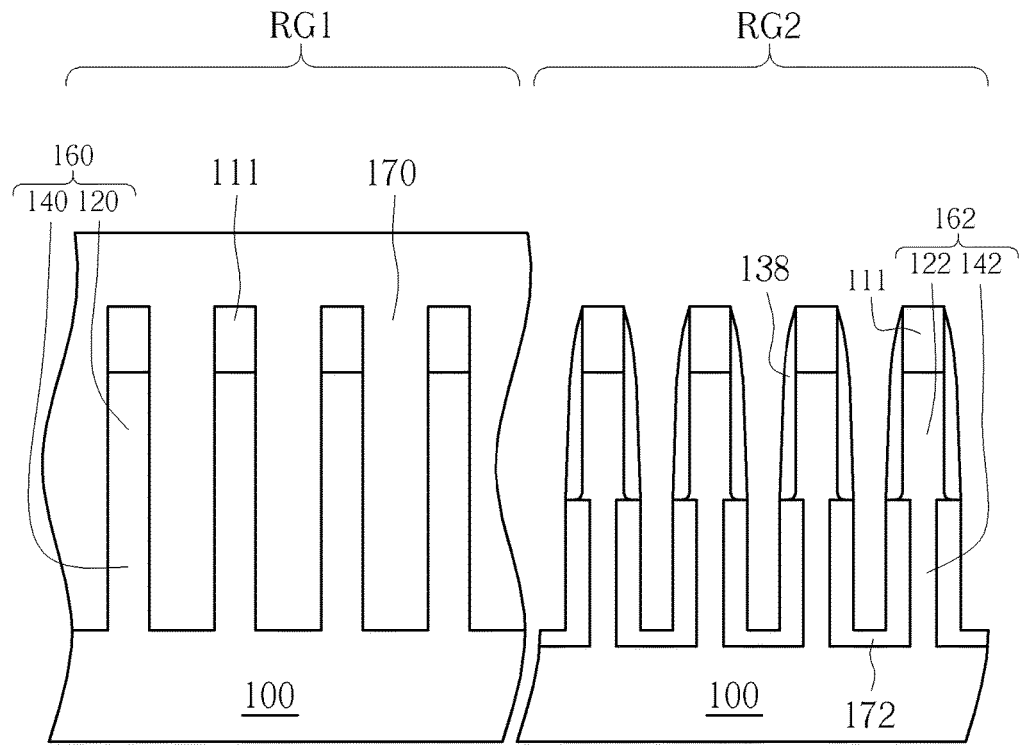
Figure 12:
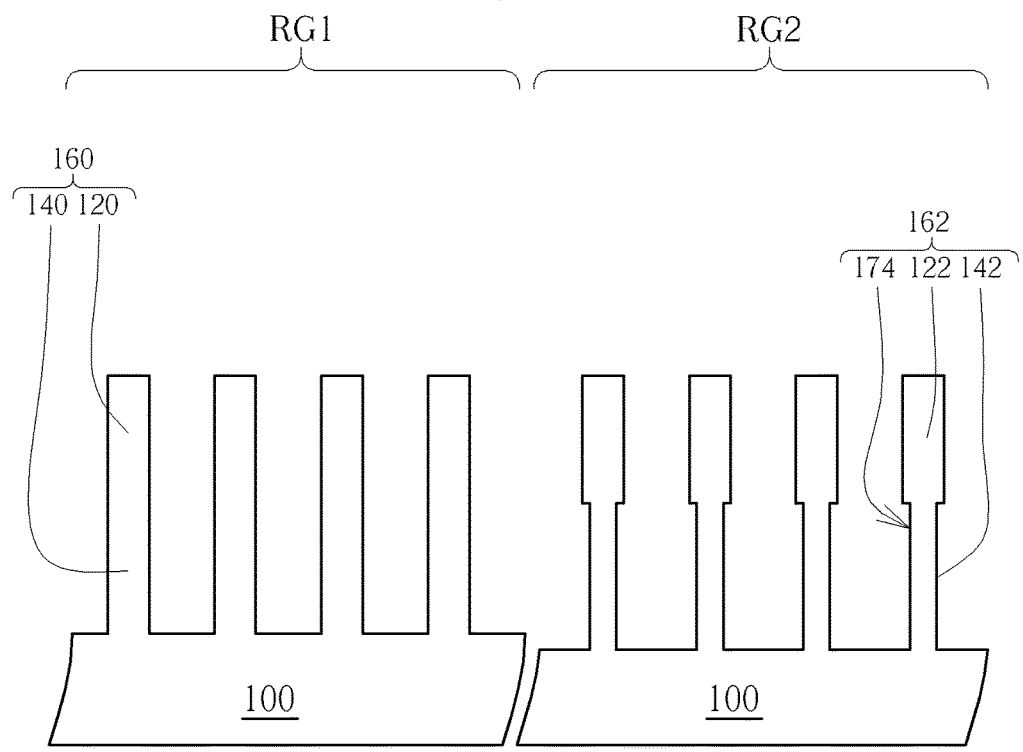

FIG. 10 to FIG. 12 are schematic diagrams of a second embodiment of the present invention. In this embodiment, the fin-shaped structure in the second region is further oxidized, and the oxidized region is removed. In this way, the base portion of the fin-shaped structure in the second region can have a reduced width. The detailed fabrication processes are disclosed below. Please refer to FIG. 10. After the step shown in FIG. 8, a mask layer 170, such as a photomask layer or a dielectric layer, is fabricated to cover the first fin-shaped structure 160 in the first region RG1 and to expose the base portion 142 of the second fin-shaped structure 162. Subsequently, as shown in FIG. 11, an oxidation process is carried out to by using the mask layer 170, the patterned mask 111 and the spacers 138 as a mask. During the oxidation process, an oxide layer 172 may be formed on the surface of the semiconductor substrate 100 and on the sidewalls of the second fin-shaped structure 162 in the second region RG2. In contrast, the first fin-shaped structure 160 is not oxidized during the processing because it is completely covered by the mask layer 170. Afterwards, an etching process may be carried out to remove the patterned mask 111, the spacers 138, the mask layer 170 and oxide layer 172. The corresponding structure is shown in FIG. 12, in which an etched area, also called a recessed region, is formed on the sidewall of the lower portion of the second fin-shaped structure 162 in the second region RG2. In this way, the base portion 142 of the second fin-shaped structure 162 is narrower than the top portion 122 of the second fin-shaped structure 162. The following process is similar to that shown in FIG. 9.

According to the second embodiment disclosed in the above paragraph, the mask layer 170 is formed after the formation of the first fin-shaped structure 160, but is not limited thereto. For example, the mask layer 170 may be formed between forming the material layer 132 and forming the base portions 140 and 142 of the fin-shaped structures.

Figure 13:
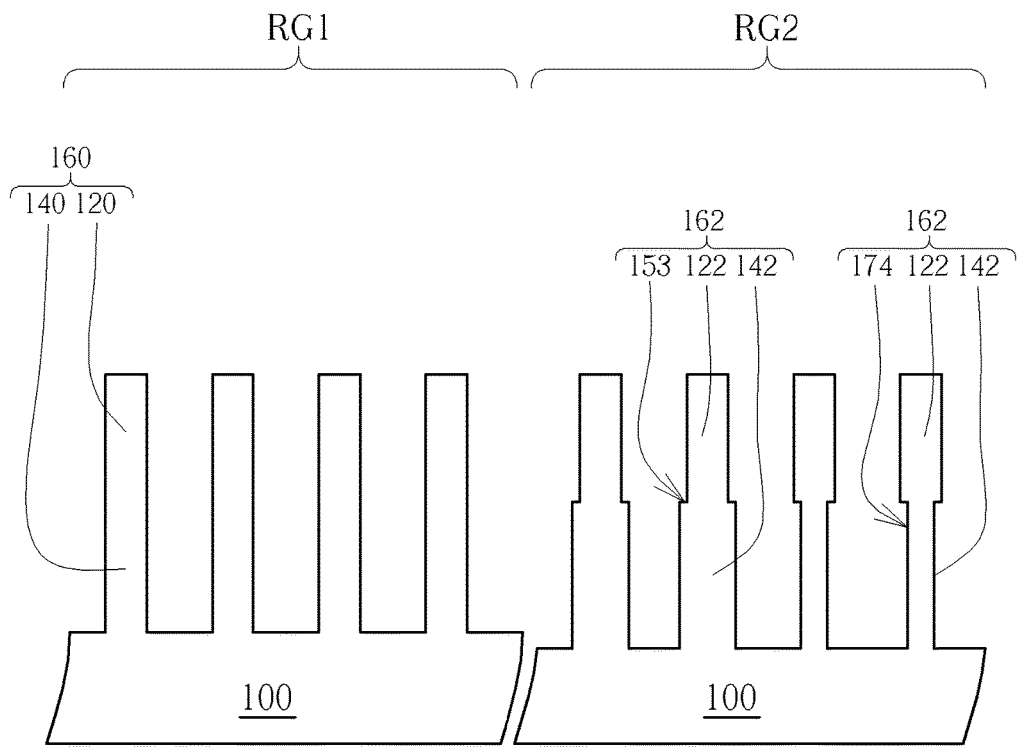
Figure 15:
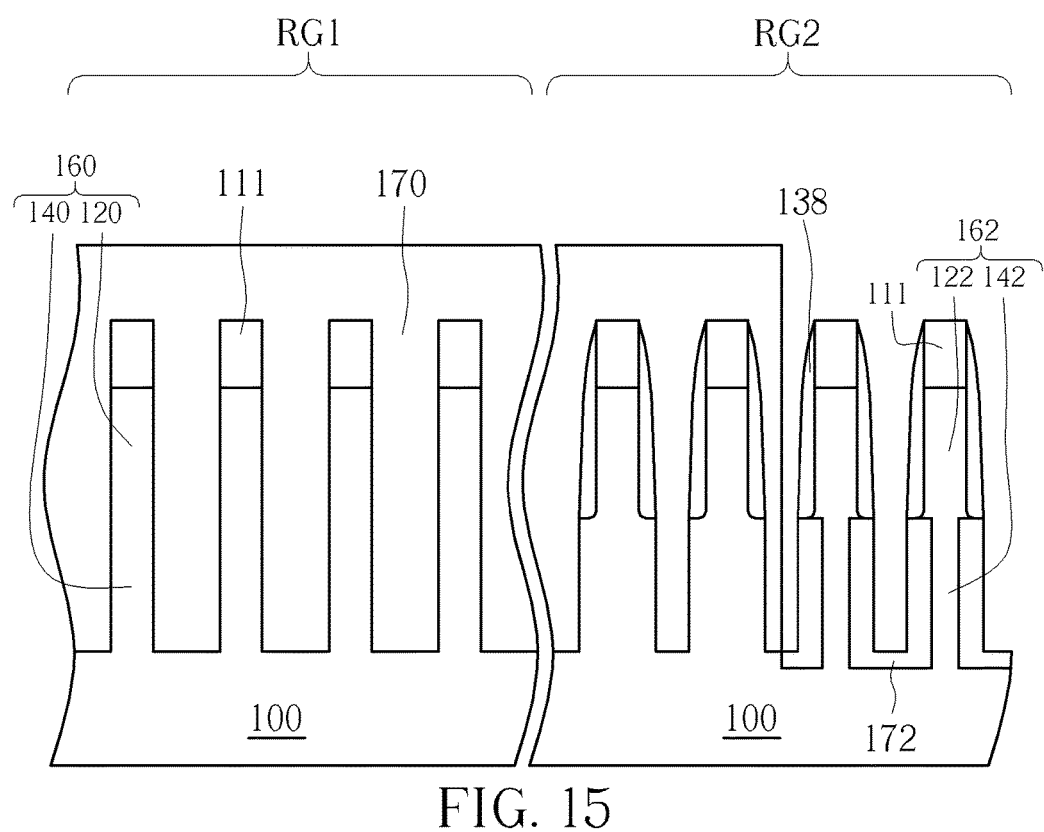

FIG. 13 is a schematic diagram of a third embodiment of the present invention. This embodiment incorporates the features of the first and second embodiments in a way that the fin-shaped structures may respectively have a recess or an etched area. Specifically, the lower portions of the right-hand side second fin-shaped structure 162 in the second region RG2 may have etched areas 174, also called recessed regions. Therefore, the base portion 142 of the second fin-shaped structure 162 is narrower than the top portion 122 of the second fin-shaped structure 162. In contrast, the sidewalls of the left-hand side second fin-shaped structure 162 in the second region RG2 may respectively have recesses 153, also called recessed regions, adjacent to the junction of the base portion 142 and the top portion 122. Therefore, the base portion 142 of the second fin-shaped structure 162 is wider than the top portion 122 of the second fin-shaped structure 162. This fin-shaped structure may be formed by carrying out the oxidation process only to the right-hand side second fin-shaped structure 162 in the second region RG2. As shown in FIG. 15, unlike the one shown in FIG. 11, the mask layer 170 in the FIG. 15 is formed to cover the first fin-shaped structure 160 in the first region RG1 and the left-hand side second fin-shaped structure 162 in the second region RG2 to expose the base portion 142 of the right-hand side second fin-shaped structure 162. Therefore, the base portion 142 of the right-hand side second fin-shaped structure 162 may be oxidized with the mask layer 170, the patterned mask 111 and the spacers 138 as a mask during the oxidation process. In this way, the oxide layer 172 may be formed on the surface of the semiconductor substrate 100 and only on the sidewalls of the right-hand side second fin-shaped structure 162 in the second region RG2. By carrying out an etching process to remove the oxide layer 172 in FIG. 15, the fin-shaped structure of FIG. 13 may be obtained.

Figure 14:
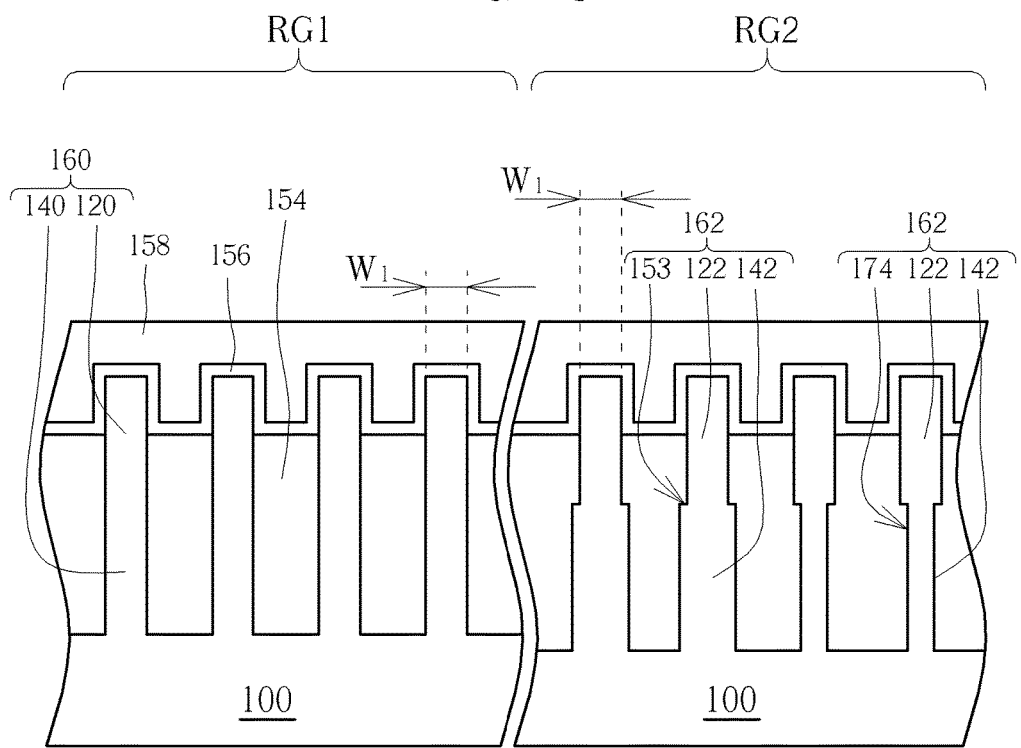

The process similar to that shown in FIG. 9 may be carried out so as to fabricate the structure shown in FIG. 14. Please refer to FIG. 14. The structure includes at least the shallow trench isolation structure 154 and the gate structure. In detail, the top surface of the shallow trench isolation structure 154 may have a predetermined height so that the first and second fin-shaped structures 160 and 162 may protrude from the top surface of the shallow trench isolation structure 154. The gate structure also includes the gate dielectric layer 156 conformally disposed on the fin-shaped structures 160 and 162 and the gate electrode layer 158 disposed on the gate dielectric layer 156.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
   providing a semiconductor substrate having a first region and a second region;
   forming a patterned mask in the first and second regions of the semiconductor substrate;
   etching the semiconductor substrate by using the patterned mask as an etch mask so as to form a patterned structure on the surface of the semiconductor substrate;
   forming a spacer disposed on the sidewall of the patterned structure in the second region;
   etching the semiconductor substrate by using the patterned mask and the spacer as an etch mask so as to form a plurality of fin-shaped structures in the first and second regions of the semiconductor substrate;
   forming a first mask layer covering the fin-shaped structures in the first region and a number of the fin-shaped structures in the second region;
   forming an oxide layer on sidewalls of the fin-shaped structures exposed from the first mask layer, the patterned mask and the spacer in the second region; and
   removing the oxide layer, so that the number of the fin-shaped structures in the second region have base portions narrower than top portions and the other fin-shaped structures in the second region have base portions wider than top portions.

2. The method of claim 1, before the step of forming the spacer, further comprising:
   depositing a material layer conformally covering the fin-shaped structures;
   forming a second mask layer covering the material layer in the second region so that the material layer in the first region is exposed from the mask layer; and
   etching the material layer in the first region by using the second mask layer as an etch mask.

3. The method of claim 1, wherein the fin-shaped structures comprise:
   a plurality of first fin-shaped structures disposed on a semiconductor substrate, wherein each of the first fin-shaped structures comprises:
   a base portion disposed on the semiconductor substrate; and
   a top portion extending from the base portion of the first fin-shaped structure, wherein the top portion of each of the first fin-shaped structure has a first width; and
   a plurality of second fin-shaped structures disposed on the semiconductor substrate, wherein each of the second fin-shaped structures comprises:
   the base portion disposed on the semiconductor substrate; and
   the top portion extending from the base portion of the second fin-shaped structure, wherein the top portion of each of the second fin-shaped structure has the first width; and
   a recessed region disposed on a sidewall of each of the second fin-shaped structures.

4. The method of claim 1, wherein the fin-shaped structures are separately disposed on the semiconductor substrate.

5. The method of claim 1, wherein the top portions of the first fin-shaped structures have equal width.

6. The method of claim 1, further comprising:
   depositing a dielectric layer to cover the fin-shaped structures; and
   performing an etching process until each of the fin-shaped structures partially protrudes from a top surface of the dielectric layer.

7. The method of claim 1, after the step of forming the fin-shaped structures, further comprising:
   removing the spacer;
   depositing a gate dielectric layer conformally covering the fin-shaped structures;
   depositing a gate electrode layer covering the gate dielectric layer; and
   patterning the gate dielectric layer and the gate electrode layer to form a gate structure.

* * * * *